United States Patent
van Eerd et al.

(10) Patent No.: US 9,367,647 B2
(45) Date of Patent: Jun. 14, 2016

(54) METHOD OF PROVIDING SYSTEM DESIGN

(75) Inventors: Mike Patrick van Eerd, Duebendorf (CH); John Wilkes, Palo Alto, CA (US)

(73) Assignee: Hewlett Packard Enterprise Development LP, Houston, TX (US)

(*) Notice: Subject to any disclaimer, the term of this patent is extended or adjusted under 35 U.S.C. 154(b) by 1121 days.

(21) Appl. No.: 11/358,597

(22) Filed: Feb. 21, 2006

(65) Prior Publication Data

US 2007/0208540 A1   Sep. 6, 2007

(51) Int. Cl.
*G06F 17/50* (2006.01)

(52) U.S. Cl.
CPC ........................... *G06F 17/50* (2013.01)

(58) Field of Classification Search
USPC .......................................................... 703/1
See application file for complete search history.

(56) References Cited

U.S. PATENT DOCUMENTS

| | | | |
|---|---|---|---|
| 5,668,995 A * | 9/1997 | Bhat | 718/104 |
| 6,453,269 B1 * | 9/2002 | Quernemoen | G06F 11/3428 702/186 |
| 6,487,562 B1 | 11/2002 | Mason, Jr. et al. | |
| 6,904,396 B1 | 6/2005 | Schramek | |
| 2003/0033132 A1 * | 2/2003 | Algieri et al. | 703/22 |

OTHER PUBLICATIONS

Reich, Robert. "Building the First Industry-Standard Storage Benchmark" 2002.*

Ideas ("Ideas International Evaluation of IBM's Commercial Processing Workload (CPW) for Rating Relative Performance of IBM eServer iSeries Systems"). Jun. 2005.*

* cited by examiner

*Primary Examiner* — Saif Alhija
(74) *Attorney, Agent, or Firm* — Trop, Pruner & Hu, P.C.

(57) ABSTRACT

An embodiment of a computer implemented method of providing a design of a system receives a relative performance specification for the system. A particular system design is returned that is expected to perform at about the relative performance specification.

21 Claims, 3 Drawing Sheets

METHOD OF PROVIDING SYSTEM DESIGN

FIELD OF THE INVENTION

The present invention relates to the field of designing systems. More particularly, the present invention relates to the field of designing systems where a computer aids in designing the systems.

BACKGROUND OF THE INVENTION

Much system design ignores performance goals, or simply uses "best effort," which often means that performance is whatever the system happens to provide. Other approaches have offered solutions based upon selecting from design classes. For example, in the area of storage system design a solution based class may be specified as, "EVA disk array having RAID 10 storage." This merely transfers the problem to the designer who has to predict whether the design class will be adequate and who also has to determine whether the workload for the system will allow the system to deliver adequate performance.

Some work attempts to specify explicit performance goals (e.g., I/O operations per second or maximum response time for a transaction). This assumes that a customer or the designer can specify the explicit performance goals needed. Often, this is not the case and, indeed, many times neither the customer nor the designer has an adequate way of determining such explicit performance goals.

Some work assumes that absolute values can be measured from an existing running system and such absolute values are used as a specification for the next generation system or for an incremental improvement of the existing system. This is better than the previous approach, because it is based upon "what is happening now," but it fails to account for relative changes in the business environment. What may be a good basis for this year might be adequate for the short term but may be a poor basis for a system design for the longer term as the competitive climate changes, technology advances, and demands are altered.

It would be desirable to have a method of providing a system design that does not suffer these difficulties.

SUMMARY OF THE INVENTION

The present invention is a computer implemented method of providing a design of a system. According to an embodiment, the method receives a relative performance specification for the system. A particular system design is returned that is expected to perform at about the relative performance specification.

These and other aspects of the present invention are described in more detail herein.

BRIEF DESCRIPTION OF THE DRAWINGS

The present invention is described with respect to particular exemplary embodiments thereof and reference is accordingly made to the drawings in which.

DETAILED DESCRIPTION OF A PREFERRED EMBODIMENT

The present invention is a computer implemented method of providing a system design. Preferably, the computer implemented method provides a storage system design. Alternatively, the computer implemented method provides another system design such as another computer system design (e.g., a utility data center design).

Figure 1:
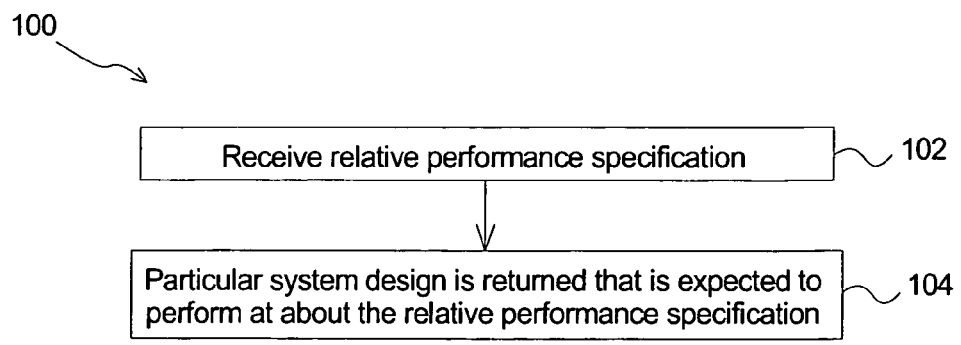
FIG. 1 illustrates an embodiment of a method of providing a system design of the present invention as a flow chart.

An embodiment of a computer implemented method of providing a design of a system is illustrated as a flow chart in FIG. 1. In an embodiment, the method 100 begins with a first step 102 receiving a relative performance specification for the system. The term "relative performance" as used herein refers to performance of a class of systems class relative to other systems according to a performance metric. The term "percentile relative performance" refers to a percentile measure of a system design relative to the system designs of a class. For example, a fiftieth percentile relative performance for a system design refers to a system design that has a performance that has as many other systems with lower performance as have higher performance; a "mean relative performance" refers to one that is equal to the average (mean) performance of the systems being compared against; and a "mid-point relative performance" refers to one that is half way between a worst-in-class system and a best-in-class system. The relative performance specification specifies a performance metric in relative terms, rather than in, say, absolute ones. Exemplary performance metrics for a computer system include throughput, capacity, transaction response time, availability, reliability, flexibility, utilization, and risk level. The relative performance specification may be referred to as a primary relative performance specification; in alternative embodiments, discussed below, one or more secondary relative performance specifications may be received for other metric values of interest.

In a second step 104, a system design is returned that is expected to perform at a level close to, or equal to, or consistent with, that defined by the relative performance specification. The term "at about the [relative] performance specification" means the same thing in what follows. In an embodiment, the system design is determined by accessing a database. Such a database is a collection of relative performance data and may include records, where each record includes system characteristics, a candidate system design (e.g., an equipment specification), and a relative performance rating that is determined dynamically as new system designs are added to the database and old system designs are removed from the database.

Figure 2:
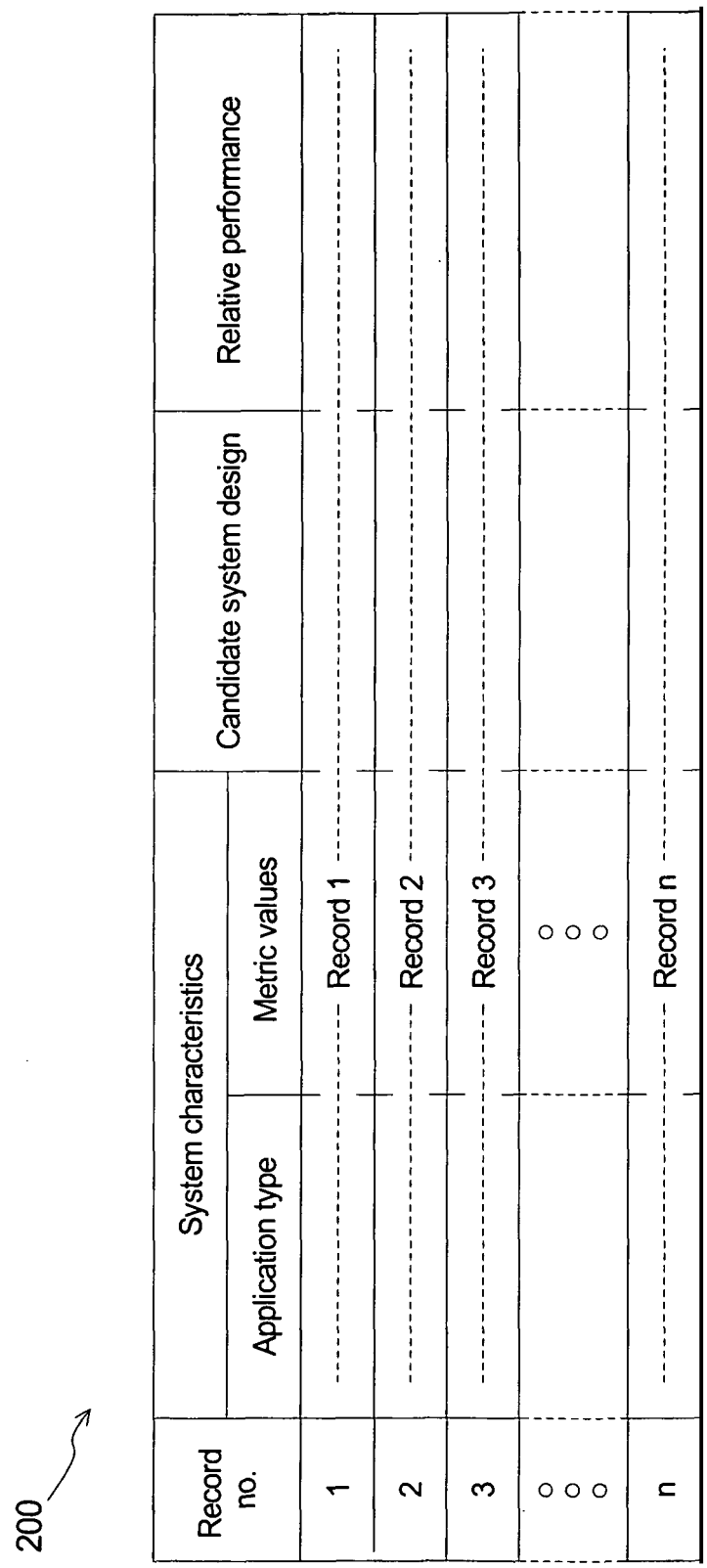
FIG. 2 illustrates an embodiment of a database of the present invention as a table.

An embodiment of a database of designs is provided as a table in FIG. 2. Records are indicated as rows; columns provide categories of information of each record. The database 200 includes records 1 through n and categories of information of system characteristics, candidate system designs, and relative performance.

The system characteristics may include an application type (e.g., a business function or process such as order entry, payroll, or purchasing), a specific application program (e.g., a particular named software package), and one or more metric values. The system characteristics may further include one or more of an application scale (e.g., small, medium, or large scale, or "400 users"), an industry segment, a particular solution kind (e.g., "disaster failure-tolerant, using data replicated across 2 sites"), or other details. The metric values provide the basis for the relative performance. While the metric values are likely to be constant, the relative performance is likely to change over time as new system designs are added to the database and old systems are removed from the database. For example, a metric value for a system that has a relative performance of 100% today may have a lower relative performance within a year or less as technology to implement it improves, or competitive pressures increase expectations. The metric values include at least one performance parameter such as throughput, capacity, response time, availability, reliability, flexibility, utilization, or risk level and may include other metric values such as cost and variability measures on the base metrics. The metric values included in a record may depend upon application type, system design, or many other factors.

Each record includes a candidate system design or a reference to a candidate system design (e.g., system design X corresponds to a system design specification known as "system design X" that exists separately from the database). A candidate system design may be an equipment specification; or a data layout; or a system configuration; or a set of system parameter settings; or some combination of these; or some other system design specification. A particular candidate system design may have been designed by an automated design tool or designed by a human designer or it may have been designed by a human designer working in conjunction with an automated design tool. Alternatively, the equipment specification of a record, or an equipment specification interpolated or extrapolated from two or more records, may be used a starting point for the system design, which may be designed by an automated design tool or by a human designer.

It will be readily apparent to one skilled in the art that design techniques employing an automated design tool or a human designer are common methods of designing systems. For example, numerous automated design tools and partially automated design tools exist for many categories of systems including storage systems. Also, systems have been traditionally designed by human designers and this practice continues today.

If a particular relative performance specification is between the relative performance in two records in the database, the particular system design may be determined by interpolating between the candidate designs for the two records. Alternatively, if a particular relative performance specification is outside of the relative performance for two or more records, the particular system design may be determined by extrapolating from the two or more records. For example, extrapolation may be used to determine a system design having a relative performance that exceeds the relative performance of the records of the database (e.g., a relative performance specification of 110%).

According to an embodiment, a benchmarking system captures relative performance data such as the system characteristics and the metric values for the database. Preferably, the benchmarking system employs automatic reporting from multiple instances or sites where an application is running. The automatic reporting may include data flow to a neutral data collection service or it may include data flow between service sites according to a sharing agreement between entities such as firms, business units, government agencies, and others. The automatic reporting may employ continuous reporting, regular polling, or random sampling. Alternatively, the benchmarking system employs another benchmarking technique such as industry surveys.

Preferably, the database is made available over the Internet (e.g., as a Web site or service). Alternatively, the database may be made available by another technique such as by way of a subscription distribution (e.g., by CD-ROM or email once a month). Access to the database may be restricted to contributors, or subscribers, or to those who pay for each access; it may also be funded by other techniques such as advertising or sponsorship fees; it may even be donated freely to the community of users. Similar techniques may be used to permit selective access to parts of the database, or old copies of it, while imposing fees for the remainder or up to date versions.

The database may be accessed to determine a list of businesses that meet a percentile relative performance query. The database may be accessed to determine a percentile relative performance that resides at a "knee" of a relative performance/cost curve.

Figure 3:
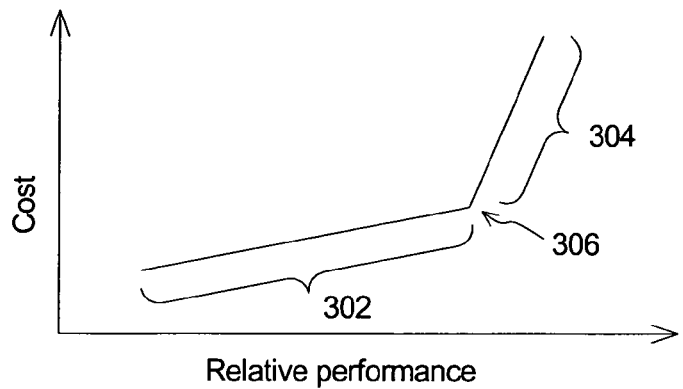
FIG. 3 illustrates an exemplary relative performance/cost curve in accordance with an embodiment of the present invention.

An exemplary relative performance/cost curve is provided in FIG. 3. Relative performance is indicated by the horizontal axis and cost is indicated by the vertical axis. Lower relative performance 302 may have a relatively low rate of cost increase for increasing relative performance. Higher relative performance 304 may have a relatively high rate of cost increase for increasing relative performance. The intersection of the lower and higher relative performances, 302 and 304, is the knee 306 of the relative performance/cost curve. A percentile relative performance at the knee 306 may provide an optimal cost/benefit.

Figure 4:
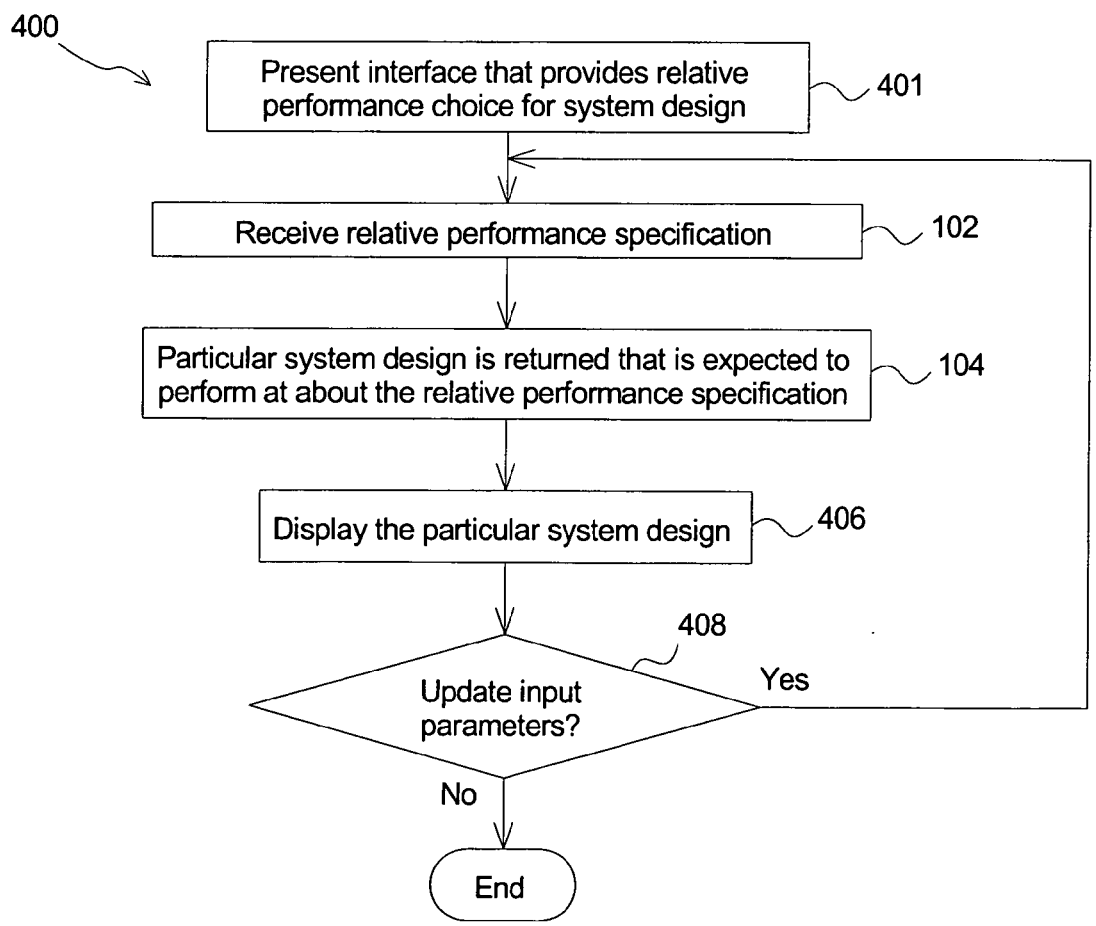
FIG. 4 illustrates another embodiment of a method of providing a system design of the present invention as a flow chart.

Another embodiment of a computer implemented method of providing a design of a system is illustrated as a flow chart in FIG. 4. The method 400 begins with an initial step 401 of presenting an interface that provides a relative performance choice for the system design. The interface may be a presentation layer such as a graphical user interface, a wizard, a command interface such as a command-line, or another user interface. Alternatively, the interface may be an interface to another computer or software program or design tool. The relative performance choice may be a percentage choice or a fractional choice or a type of average of a performance metric as it relates to currently functioning systems being employed for an application of interest. For example, for an on-line transaction processing system, performance may be measured by the performance metric of completed transactions per unit time. The performance metric may be a combination of metric values (e.g., processing speed and memory for a computer). Alternatively, the performance metric value may be some other metric value such as cost, throughput, capacity, transaction response time, availability, reliability, flexibility, utilization, or risk level.

In an embodiment, the method 400 concludes with the first and second steps, 102 and 104, of the method 100. In the first step 102, a relative performance specification for the system is received. In the second step 104, a particular system design is returned that is expected to perform at about the relative performance specification.

In another embodiment, the method 400 further includes third and fourth steps, 406 and 408. In the third step 406, the particular system design is displayed for a user. In the fourth step 408, the user may choose to update input parameters. If such a choice is made, the method 400 returns to the first step 102. If not, the method 400 concludes.

Figure 5:
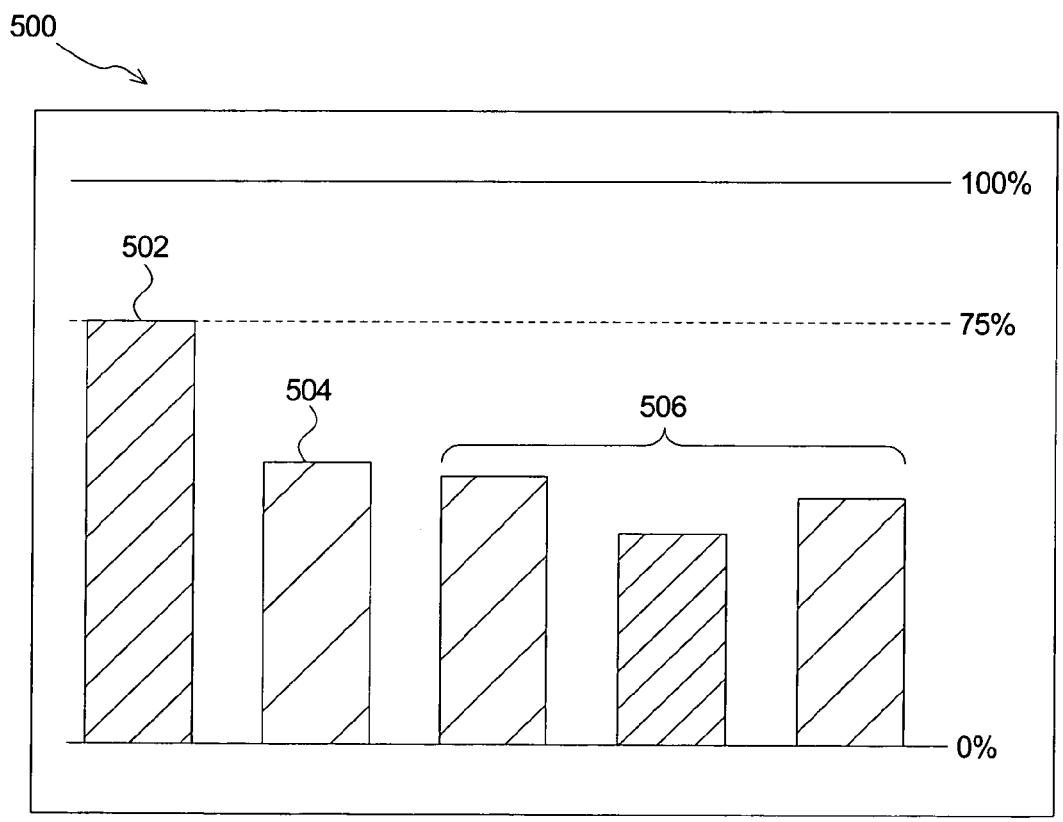
FIG. 5 illustrates an exemplary graphical user interface in accordance with an embodiment of the present invention.

An embodiment of an exemplary graphical user interface that may be employed in the initial step 401 is illustrated in FIG. 5. The graphical user interface 500 includes a vertical bar 502 that may be dragged up or down (e.g., by a user employing an input device such as a mouse) to indicate a relative performance choice for the system design. As illustrated in FIG. 5, the vertical bar 502 for the user's relative performance choice is set at 75%.

In an alternative embodiment, the user interface also presents a relative cost choice for the system design in addition to the relative performance choice. For example, the graphical user interface 500 (FIG. 5) may include a percentile cost bar 504, which may be dragged up or down using an input device. Such an embodiment may include accepting a particular relative cost choice if both a particular relative performance choice and the particular relative cost choice are feasible; if not, the particular relative cost choice may be rejected or the closest feasible relative cost may be returned.

In another alternative embodiment, the user interface presents a plurality of secondary relative performance choices for the system design. For example, the graphical user interface 500 may include additional relative performance bars 506. In such an embodiment, the second step 504 of receiving the relative performance selection may further include receiving a secondary relative performance selection for at least one of the secondary relative performance choices. Such an embodiment may include returning default values (e.g., fiftieth percentile) or returning available ranges (e.g., fortieth to seventieth percentile) for at least some of the secondary relative performance choices. For the former, an adjustment may be made to one or more of the default values and remaining default values may be adjusted in response. For the latter, a secondary relative performance selection may be made within one or more of the available ranges and a revised system design may be returned in response.

In another alternative embodiment, the method 100 further comprises receiving an existing system design. For example, the existing design may be an on-line transaction processing currently in use. In this alternative embodiment, the particular system design that is returned in the second step 104 is based on making an incremental change to the existing system design. For example, for the on-line processing transaction system, the incremental change may be to add hardware that improves the existing design so that completed transactions per unit time meet the particular relative performance choice.

The foregoing detailed description of the present invention is provided for the purposes of illustration and is not intended to be exhaustive or to limit the invention to the embodiments disclosed. Accordingly, the scope of the present invention is defined by the appended claims.

What is claimed is:

1. A method of providing a design of a system, comprising:
receiving, by a computer, a relative performance specification for the system, the relative performance specification specifying a target performance relative to performance of system designs of a class of systems;
determining, by the computer based on accessing a database, a new system design that is expected to perform at the relative performance specification, wherein the database comprises records for corresponding different candidate system designs, each record of the records comprising respective system characteristics, information of a respective candidate system design of the candidate system designs, and a respective relative performance value, wherein the determining comprises:
determining that the relative performance specification is different from the relative performance values in the records of the database, and
in response to determining that the relative performance specification is different from the relative performance values in the records of the database, deriving the new system design based on plural candidate system designs of the candidate system designs; and
returning, by the computer, the new system design that is expected to perform at the relative performance specification.

2. The method of claim 1 further comprising presenting a user interface that provides a relative performance choice for the new system design, the relative performance choice comprising a moveable control element in the user interface, and wherein movement of the moveable control element provides a particular selection of the relative performance choice that forms the relative performance specification.

3. The method of claim 2 wherein the user interface further presents a relative cost choice for the system design, the method further comprising receiving a particular relative cost selection.

4. The method of claim 2 wherein the relative performance choice presented by the user interface is a primary relative performance choice, and the user interface further presents one or more secondary relative performance choices.

5. The method of claim 4 further comprising receiving a secondary relative performance specification for at least one of the one or more secondary relative performance choices.

6. The method of claim 4 further comprising returning available ranges for at least some of the secondary relative performance choices.

7. The method of claim 6 further comprising:
receiving a secondary relative performance specification for at least one of the available ranges; and
returning a revised system design in response to the secondary relative performance specification.

8. The method of claim 1 wherein the system characteristics of each record of the records comprise an application type and a metric value.

9. The method of claim 8 wherein the system characteristics further comprise supplemental system characteristics, the supplemental system characteristics selected from the group of an application scale, an application program, an industry segment, a particular solution kind, and a combination thereof.

10. The method of claim 1 wherein the database is available by way of the Internet or by way of a subscription distribution.

11. The method of claim 1 further comprising receiving a percentile relative performance query and returning a list of businesses that meets the percentile relative performance query.

12. The method of claim 1 further comprising receiving an optimal cost/benefit query and returning a percentile relative performance rating that resides at a knee of a relative performance/cost curve.

13. A system comprising:
a processor; and
a non-transitory storage medium storing instructions executable on the processor to:
present by a computer, an interface that provides a relative performance choice for a system design;
receive a relative performance specification for the system in response to a particular selection of the relative performance choice, the relative performance specification specifying a target performance relative to performance of system designs of a class of systems;
determine, based on accessing a database, a new system design that is expected to perform at the relative performance specification, the database comprising records for corresponding different candidate system designs, each record of the records comprising relative system characteristics, information of a respective candidate system design of the candidate system designs, and a respective relative performance value, wherein the determining comprises:
- determining that the relative performance specification is different from the relative performance values in the records of the database, and
- in response to determining that the relative performance specification is different from the relative performance values in the records of the database, deriving the new system design based on plural candidate system designs of the candidate system designs; and return the determined new system design.

14. A non-transitory computer readable medium having stored thereon computer code, which when executed, cause a system to:
- receive a relative performance specification for a system, the relative performance specification specifying a target performance relative to performance of system designs of a class of systems;
- determine, by accessing a database, a system design that is expected to perform at the relative performance specification, wherein the database comprises records for corresponding different candidate system designs, each record of the records comprising respective system characteristics, information of a respective candidate system design of the candidate system designs, and a respective relative performance value, wherein the determining comprises:
  - determining that the relative performance specification is different from the relative performance values in the records of the database, and
  - in response to determining that the relative performance specification is different from the relative performance values in the records of the database, deriving the new system design based on plural candidate system designs of the candidate system designs; and
- return the new system design that is expected to perform at the relative performance specification.

15. The method of claim 1, wherein the relative performance specification includes a measure of relative performance of the system with respect to the system designs of the class of systems.

16. The method of claim 13, wherein the relative performance specification includes a measure of relative performance of the system with respect to the system designs of the class of systems.

17. The computer readable medium of claim 14, wherein the relative performance specification includes a measure of relative performance of the system with respect to the system designs of the class of systems.

18. The method of claim 1, wherein the deriving of the new system design comprises interpolating between the plural candidate designs in response to determining that the relative performance specification falls between the relative performance values associated with the plural candidate designs.

19. The method of claim 1, wherein the deriving of the new system design comprises extrapolating from the plural candidate designs in response to determining that the relative performance specification falls outside the relative performance values associated with the plural candidate designs.

20. The system of claim 13, wherein the deriving of the new system design comprises:
- interpolating between the plural candidate designs in response to determining that the relative performance specification falls between the relative performance values associated with the plural candidate designs, and
- extrapolating from the plural candidate designs in response to determining that the relative performance specification falls outside the relative performance values associated with the plural candidate designs.

21. The non-transitory computer readable medium of claim 14, wherein the deriving of the new system design comprises:
- interpolating between the plural candidate designs in response to determining that the relative performance specification falls between the relative performance values associated with the plural candidate designs, and
- extrapolating from the plural candidate designs in response to determining that the relative performance specification falls outside the relative performance values associated with the plural candidate designs.

* * * * *